US005378161A

United States Patent [19]

Loder

[11] Patent Number: 5,378,161

[45] Date of Patent: Jan. 3, 1995

[54] TAPERED ELECTRICAL CONNECTOR

[75] Inventor: Harry A. Loder, Austin, Tex.

[73] Assignee: Minnesota Mining and Manufacturing Company, St. Paul, Minn.

[21] Appl. No.: 102,151

[22] Filed: Aug. 4, 1993

[51] Int. Cl.[6] .......... H05K 1/00

[52] U.S. Cl. .......... 439/77; 439/62

[58] Field of Search .......... 439/62, 65, 66, 67, 439/492–499, 77, 259, 260

[56] References Cited

U.S. PATENT DOCUMENTS

| | | | |
|---|---|---|---|
| 4,768,971 | 9/1988 | Simpson | 439/329 |
| 4,875,259 | 10/1989 | Appeldorn | 24/576 |
| 4,907,975 | 3/1990 | Dranchak et al. | 439/67 |
| 4,971,565 | 11/1990 | Fox, Jr. | 439/74 |
| 5,123,852 | 6/1992 | Gillet | 439/67 |
| 5,133,667 | 7/1992 | Daughtrey | 439/67 |
| 5,156,553 | 10/1992 | Katsumata et al. | 439/62 |
| 5,160,269 | 11/1992 | Fox, Jr. et al. | 439/67 |
| 5,171,154 | 12/1992 | Casciotti et al. | 439/67 |
| 5,176,530 | 1/1993 | Reylek et al. | 439/290 |

FOREIGN PATENT DOCUMENTS

| | | | |
|---|---|---|---|
| 297484 | 11/1965 | Netherlands | 439/668 |

*Primary Examiner*—David L. Pirlot
*Attorney, Agent, or Firm*—Gary L. Griswold; Walter N. Kirn; David W. Anderson

[57] ABSTRACT

An electrical connector includes a male plug having preferably two tapered major surfaces and a female receptacle having walls corresponding in taper to the major surfaces of the male plug. The male plug is adapted to terminate a ribbon cable and may be formed by a tapered circuit board or a tapered form around which conductors of a ribbon cable are bent. The female receptacle is lined with a flexible circuit for contact to the male plug and connection to a circuit board.

8 Claims, 7 Drawing Sheets

TAPERED ELECTRICAL CONNECTOR

FIELD OF THE INVENTION

The present invention relates generally to electrical connectors and particularly those used to connect ribbon cables to printed circuit boards.

BACKGROUND OF THE INVENTION

Existing connectors used to connect ribbon cables having a series of parallel conductors covered by a sheath of insulating material to a printed circuit board typically are of the pin and socket type. These connectors employ header pins connected to either the conductors of the cable or the printed circuit board and metal sockets connected to the remaining member.

This typical construction requires a large mass of metal in the construction of the pin and socket contacts and results in cross talk between the signals conducted because of the size and proximity of the radiating contact surfaces. Connector size is necessarily large to accommodate pins and sockets, and it is difficult to reduce the distance between adjacent contact elements and thus the overall footprint of the connector on the printed circuit board.

SUMMARY OF THE INVENTION

The present invention addresses the above deficiencies of the pin and socket type connectors by decreasing the number of connector elements between the cable and the printed circuit board through the use of tapered, locking contact surfaces, flexible circuitry within the connector and, in one embodiment, the use of the conductors of the cable directly as contact elements.

In particular, the present invention includes an electrical connector having a male connector half terminating in a plug end having a vertical axis and two major surfaces wherein at least one of the major surfaces is a tapered surface disposed at an acute angle to the vertical axis, and a female connector half having walls defining a receptacle for the male connector half and a vertical axis parallel to the male connector half vertical axis wherein one of the walls is a tapered wall disposed at an angle to the female connector half vertical axis corresponding to the acute angle of the male connector half tapered surface. At least the male tapered surface and at least the female tapered wall each include corresponding individual electrical contact traces lying in planes parallel to the male tapered surface and the female tapered side wall, respectively, for making electrical contact between the male connector half and the female connector half when the connector halves are mated so as to force the male tapered surface and the female tapered wall together.

The contact traces within the female connector half are preferable formed by a flexible circuit overlying the tapered wall of the connector half, the flexible circuit being formed of a polymeric backing on which metallic conductive traces are deposited. The female connector half also preferably includes resilient backing strips between the body of the connector half and the flexible circuit, with these resilient strips most preferably being polymeric bladders filled with a substantially incompressible fluid.

The male connector half may include a tapered printed circuit board as its contact element, but it is preferred to use a tapered form around which exposed wires of the ribbon cable itself are folded and used as the male contact elements, since the number of intervening elements in the connector is greatly reduced relative to conventional connectors.

BRIEF DESCRIPTION OF THE DRAWINGS

The present invention will be more thoroughly described with respect to the accompanying drawings, wherein like numbers refer to like parts in the several views, and wherein.

DESCRIPTION OF THE PREFERRED EMBODIMENTS

Figure 1:
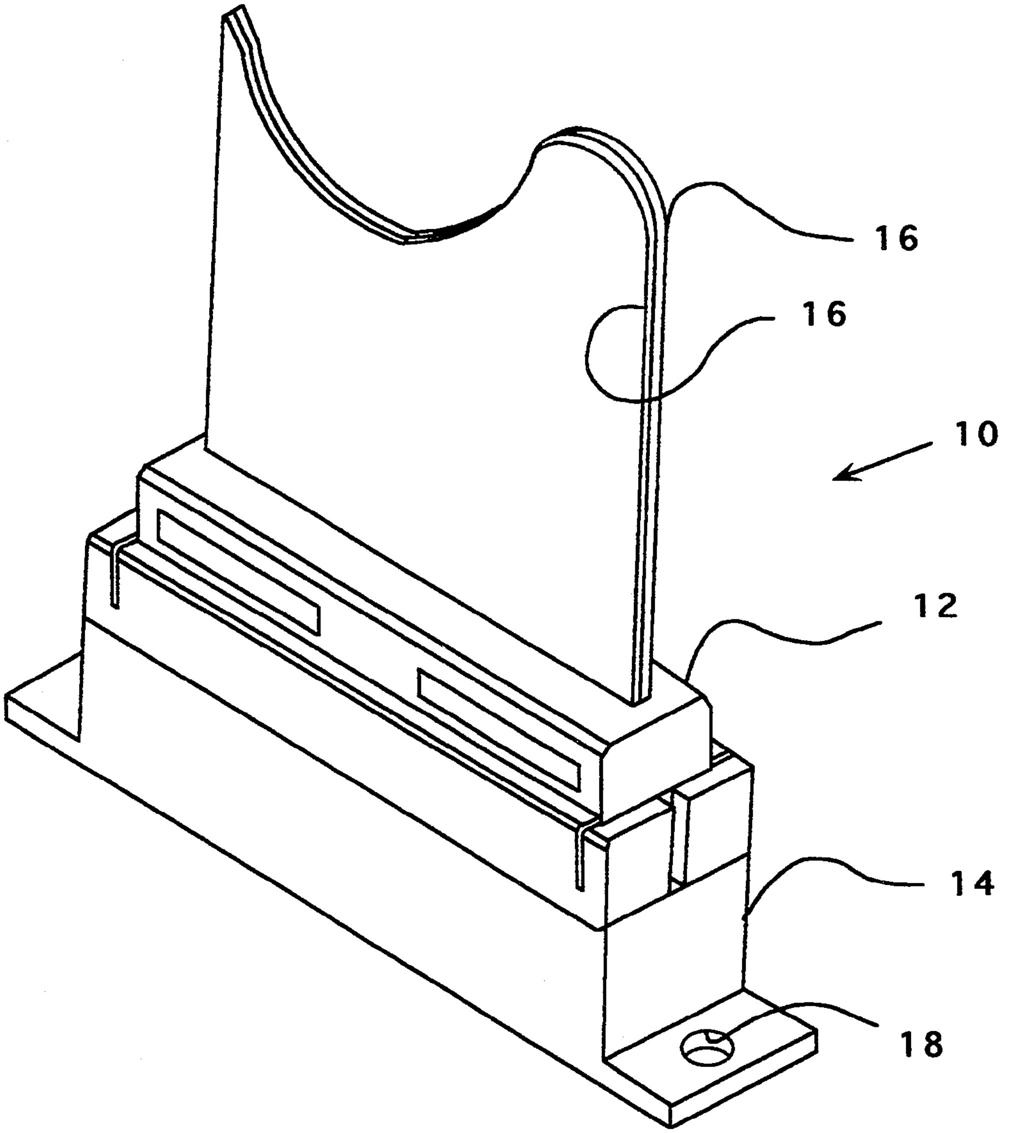
FIG. 1 is a perspective view of two mated halves of a connector according to the present invention.

FIG. 1 illustrates an electrical connector, generally indicated as 10, which includes a male connector half 12 and a female connector half 14. The male connector half 12 is adapted to terminate one or more (two are illustrated) ribbon cables 16 and connect these ribbon cables 16 to a printed circuit board (not shown) by means of the female connector half 14 mounted on the printed circuit board by fasteners (not shown) inserted through holes 18 in the female connector half 14 and into the printed circuit board. Connector halves 12 and 14 are illustrated in the mated condition but are designed to be separated and reconnected an indefinite number of times.

Figure 2:
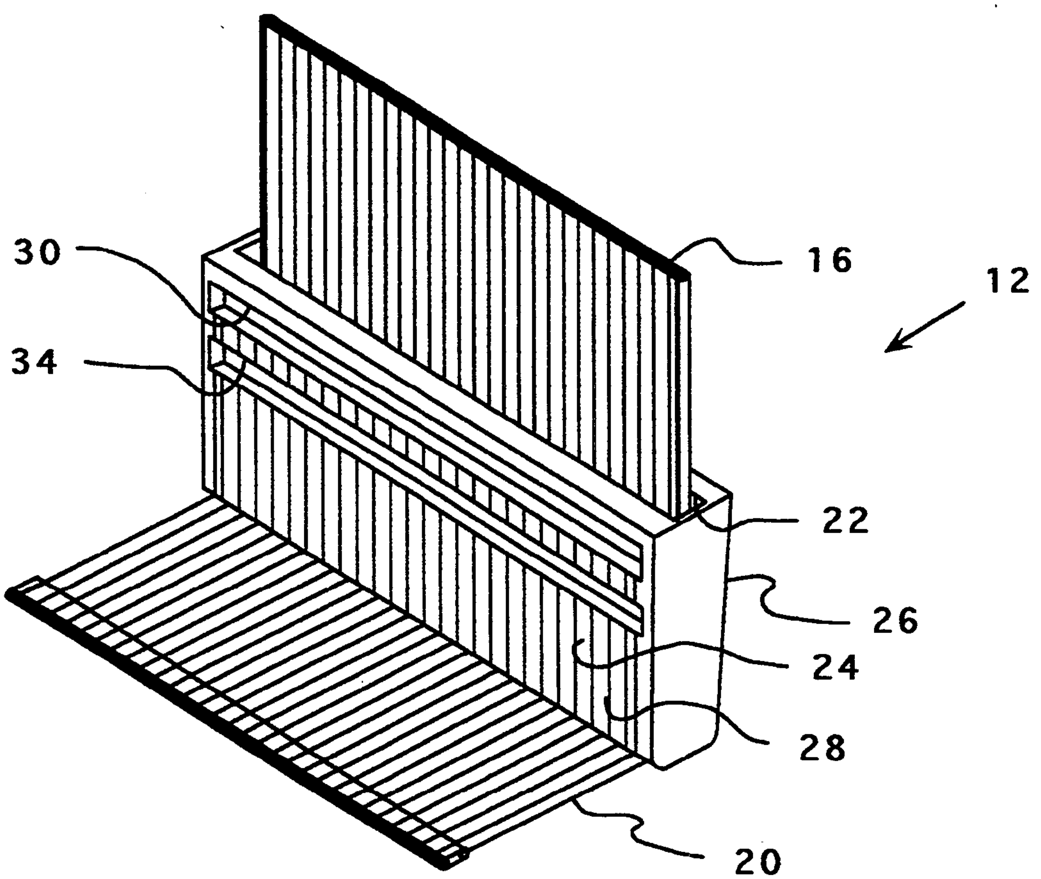
FIG. 2 is a perspective view of a partially assembled male connector half forming a portion of the connector of FIG. 1.
Figure 3:
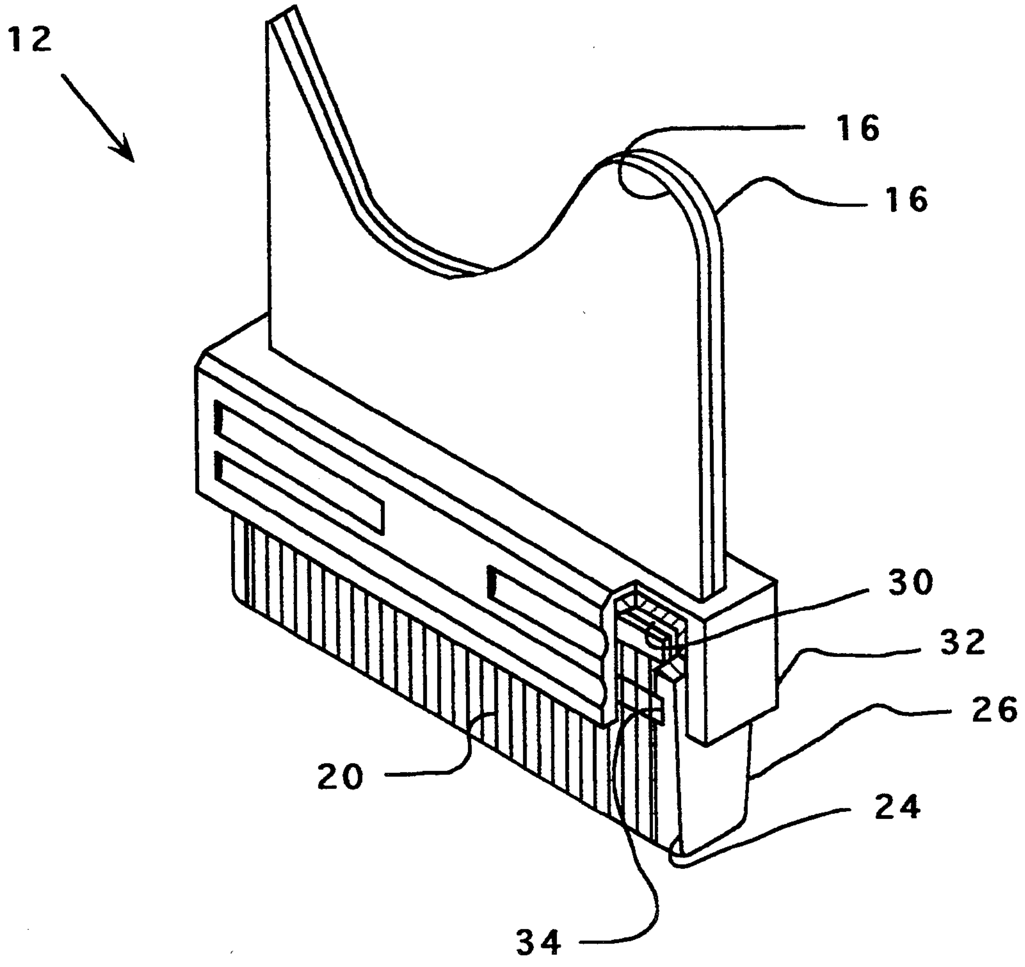
FIG. 3 is a perspective view of the male connector half of FIG. 2 in the fully assembled condition, with a portion broken away to illustrate details.

FIG. 2 illustrates the preferred embodiment of the male connector half 12 in a partially assembled condition. In this embodiment, the conductors 20 of the ribbon cable 16 are used directly as the contact elements of the male connector half 12, thus eliminating the intermediate elements, such as pins or sockets, found in conventional connectors. The male connector half 12 is generally rectangular in horizontal cross-section with a vertical axis extending parallel to the extension of the cables 16 as they are shown in FIGS. 1–3. The male connector half 12 includes a central cavity 22 for insertion of the ribbon cable or cables 16 and two major surfaces 24 and 26 defining the contact surfaces of the male connector half 12.

Figure 4:
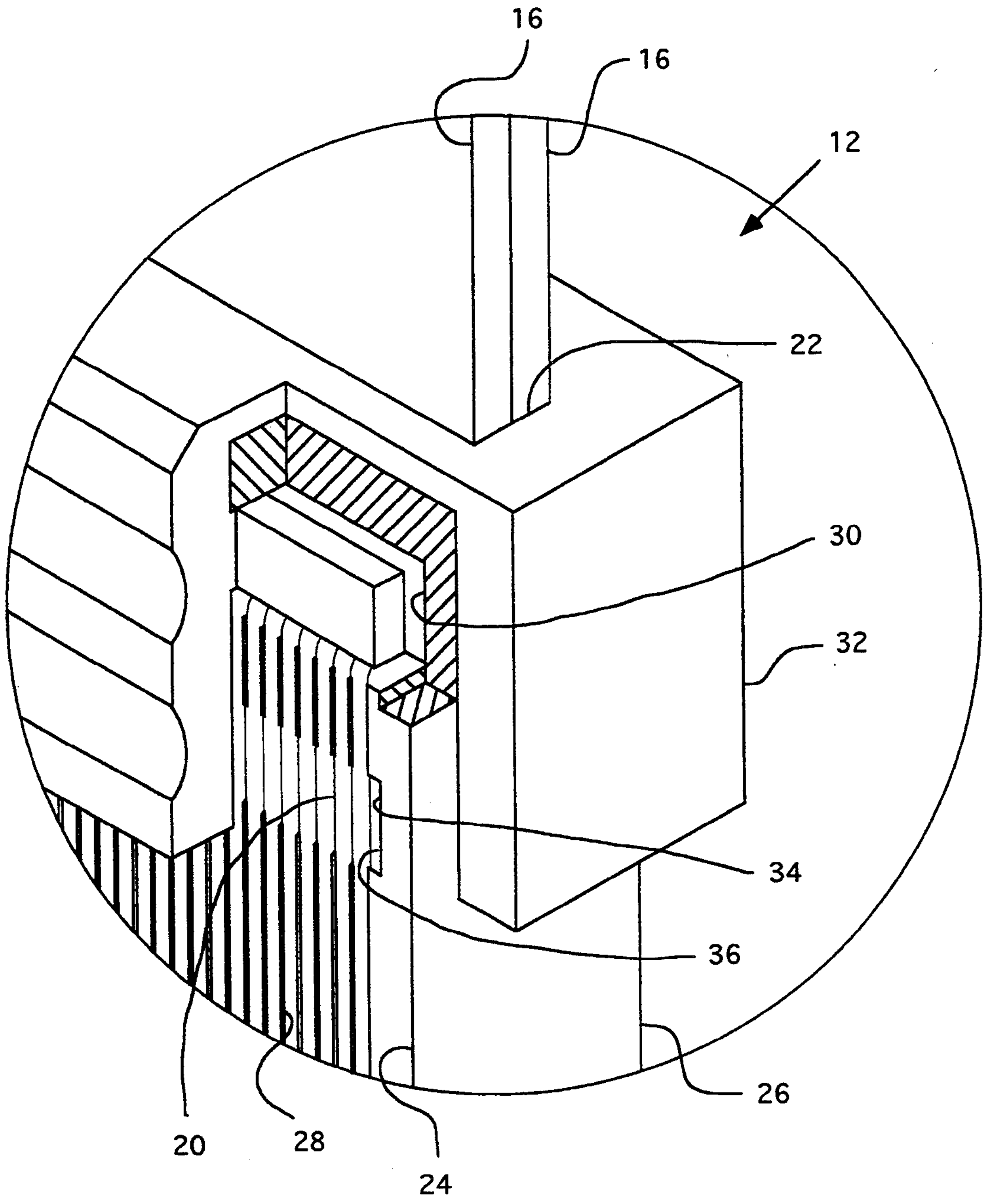
FIG. 4 is an enlarged, perspective view of a portion of the assembled male connector half of FIG. 3.

FIGS. 2–4 illustrate the steps of assembly of the cable 16 to the male connector half 12. The cable 16 is prepared by stripping a length of insulation from the cable 16 to expose the conductors 20. This operation is most conveniently done with a laser, but more conventional cutting instruments could be used. It is preferred, and illustrated in FIG. 2, that a short strip of insulation be left intact at the end of the cable 16 to maintain the conductors 20 in order and untangled. The cable 16 is then inserted through the central cavity 22 of the male connector half 12.

At least one of the major surfaces 24 and/or 26 is provided with a series of parallel grooves 28 and a recess 30 to accept the insulated end portion of the cable 16. After the stripped cable 16 has been inserted into the cavity 22 of the male connector half 12, the bare conductors 20 are bent around the end of the male connector half 12 such that one conductor 20 is inserted in each groove 28 and the insulated end of the cable 16 is inserted into the recess 30. This configuration is best seen in FIGS. 3 and 4. If it is only desired to terminate one cable 16 to the male connector half 12, the assembly is completed at this time by inserting the partial assembly into a mold and overmolding a retainer 32 over the upper region of the cable 16, as shown in FIGS. 3 and 4. Alternatively, the retainer 32 may be molded separately from the male connector half 12 in two or more pieces and held together in place over the cable 16 end by conventional fasteners. The retainer 32 functions to retain the end of the cable 16 within the recess 30, as a handle so that the male connector half 12 can be conveniently removed from and inserted into the female connector half 14 and as a strain relief for the cable 16 which extends from the male connector half 12.

As shown in FIGS. 3 and 4, a second cable 16 could be added after assembly of the first cable 16 to the male connector half 12 to provide contact surfaces on both major surfaces 24, 26 of the male connector half 12. Assembly of the second cable 16 to the male connector half 12 is accomplished in the same fashion as described above with respect to the first cable 16, except of course the cable 16 is bent in the opposite direction around the end of the male connector half 12.

As seen in FIGS. 2–4, it may be desirable to provide a second recess 34 in the major surfaces 24, 26 of the male connector half 12 to accommodate a ground bus 36. The ground bus 36 allows some of the signals to be connected to ground by bonding the conductors 20 which carry them, and also a grounded conductor 20, to the ground bus 36. This bonding may be accomplished by, for example, thermal insulation displacement welding, parallel gap welding or automatic point soldering. If thermal insulation displacement welding is employed, it may be desirable to coat the outwardly-facing surface of the ground bus 36 with a polymer such as fluorinated ethylene propylene. The advantage realized is the provision of an insulating layer between the unbonded conductors 20 and the ground bus 36.

Figure 5:
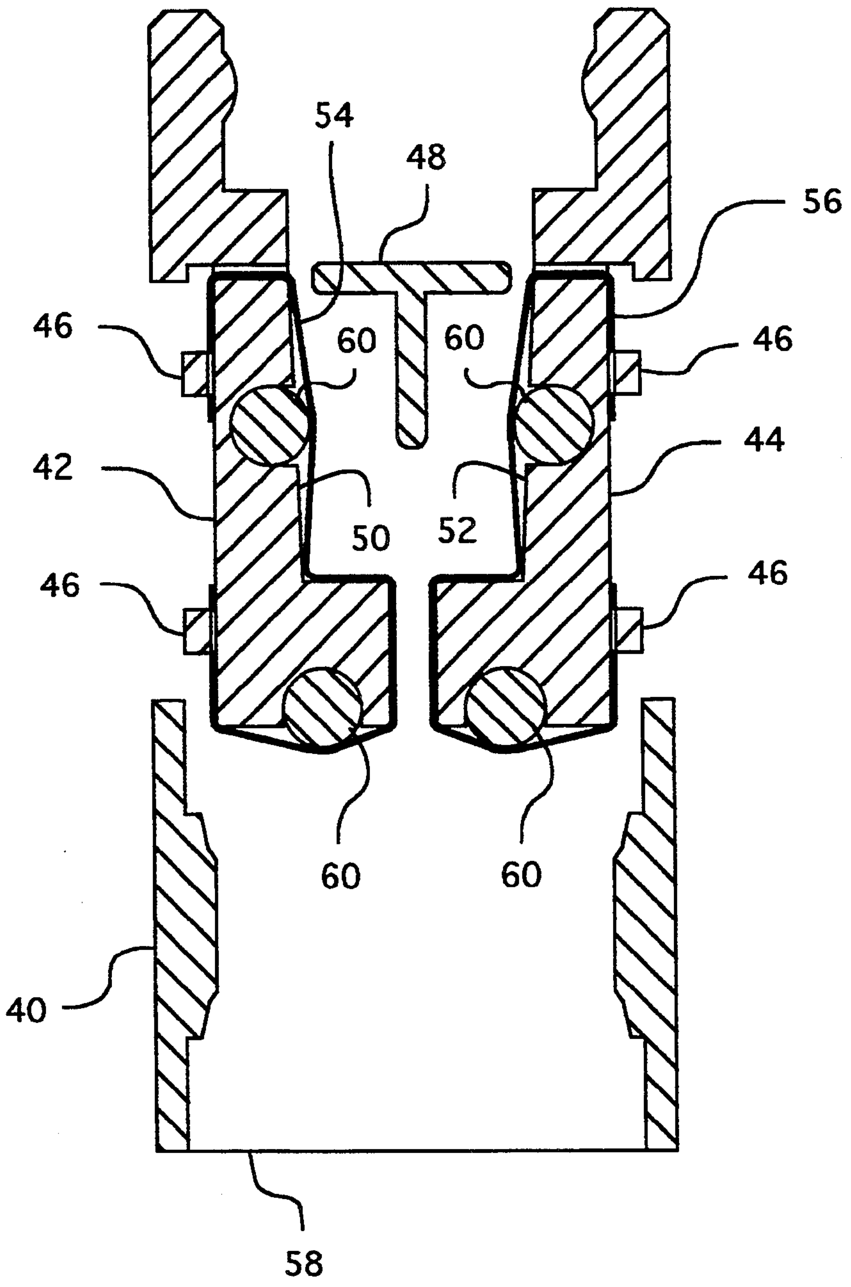
FIG. 5 is an exploded, cross-sectional view of the components of a female connector half of the connector of FIG. 1 according to the invention.
Figure 6:
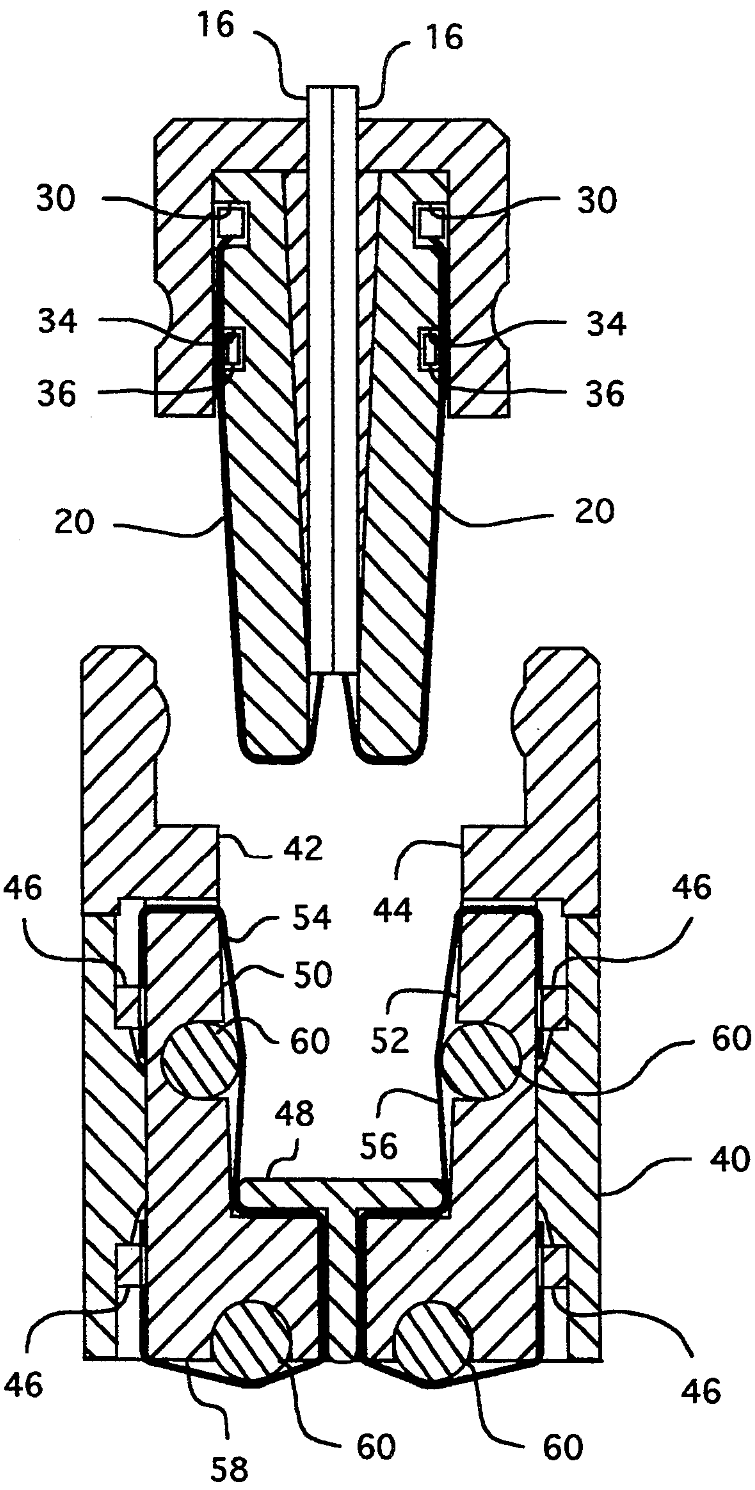
FIG. 6 is a cross-sectional view of the male and female connector halves of the connector of FIG. 1 prior to engagement.

FIGS. 5 and 6 illustrate the components and assembly of the female connector half 14. The female connector half 14 includes a shell 40 and two inserts 42 and 44 molded as mirror images of each other. The inserts 42 and 44 are positioned in the shell 40 as shown in FIG. 6 and located by means of posts 46 extending outwardly from the inserts 42 and 44. The inserts 42 and 44 are locked into the shell 40 by a retainer 48 which forces the inserts 42 and 44 outwardly into engagement with the shell 40.

The inner surfaces 50 and 52 of the inserts 42 and 44 are tapered to match the taper of the male connector half 12 and are covered with flexible circuitry 54 and 56, which is comprised of a polymeric backing upon which is deposited metal traces in the form of parallel lines. The metal traces of the flexible circuits 54 and 56 are spaced from each other a distance equal to the spacing of the conductors 20 of the male connector half 12 and thus provide corresponding electrical contacts for each of the conductors 20 of the male connector half 12. The flexible circuitry 54 and 56 is wrapped around each insert 42 and 44 to present its conductive traces to the bottom surface 58 of the female connector half 14.

The inner and bottom surfaces 50, 52 and 58 of the inserts 42 and 44 are each preferably provided with a resilient pressure member 60 which may be an elastomeric polymer or a polymeric bladder filled with a substantially incompressible fluid as described in U.S. Pat. No. 5,160,269. The pressure members 60 force the flexible circuitry 54 and 56 against the conductors 20 of the male connector half 12 and the contact traces of the printed circuit board upon which the female connector half 14 is mounted. The pressure members 60 located at the inner, tapered surfaces 50 and 52 of the inserts 42 and 44 also perform the function of producing a wiping action between the traces of the flexible circuitry 54 and 56 and the conductors 20 of the male connector half 12 as the flexible circuitry 54 and 56 conforms to the shape of the male connector half 12 upon insertion of the male connector half 12 into the female connector half 14.

Contact pressure between the flexible circuitry 54 and 56 of the female connector half 14 and the conductors 20 of the male connector half 12, and retention of the male connector half 12 within the female connector half 14 is primarily accomplished by the mating tapers provided in the male connector half 12 and the female connector half 14. Thus the resilient pressure members 60 just described are desirable to doubly ensure good contact between the connection elements of the connector 10, but are not necessary.

As described in U.S. Pat. Nos. 4,875,259 and 5,176,530, both of which are assigned to the assignee of the present invention and incorporated herein by reference, mating tapered surfaces allow a moderate insertion force to be magnified into a significant normal force at the contact surfaces between the flexible circuitry 54 and 56 and the conductors 20, and cause the tapered surfaces to lock together with significant retention force if the angles of the tapers are properly selected. According to U.S. Pat. No. 4,875,259, if the tangent of the angle of the tapered surfaces 24, 26, 50 and 52 with respect to the vertical axis of the male connector half 12 and the female connector half 14 is approximately equal to or less than the coefficient of friction of the material in contact at the tapered surface, adherence between the two articles (here the male connector half 12 and the female connector half 14) will be substantially increased.

The connector 10 just described greatly reduces the size of a connector for a given number of conductors since the number of parts intervening between the articles to be connected are for the most part eliminated. In the connector 10 only the flexible circuitry 42 and 44 is interposed between the cable 16 and the printed circuit board to which the cable 16 is to be attached. This is accomplished by the novel method of utilizing the conductors 20 themselves as connector contacts rather than attaching the conductors 20 to an intermediate article such as a pin or socket.

Figure 7:
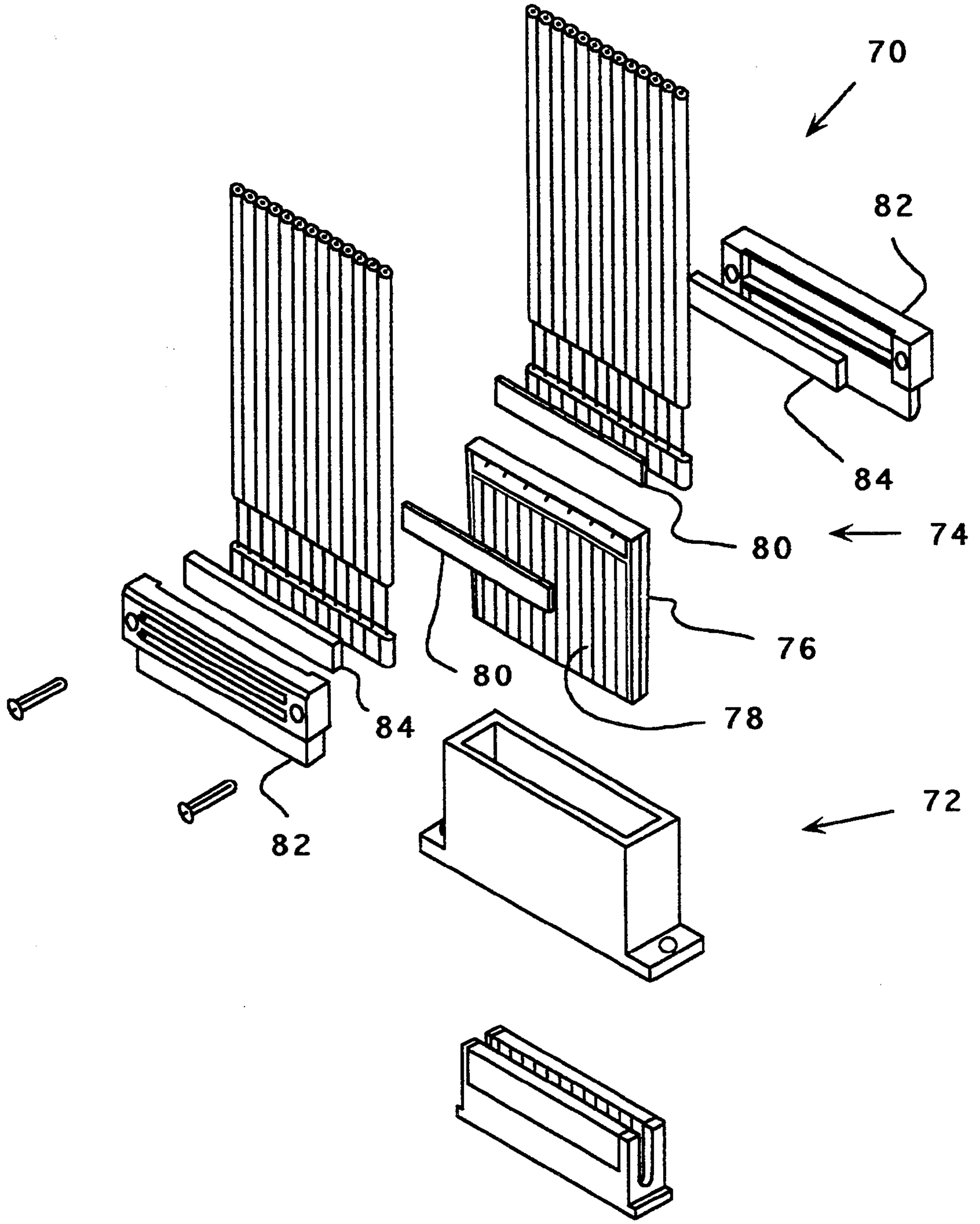
FIG. 7 is an exploded perspective view of an alternate embodiment of a connector according to the present invention.

FIG. 7 illustrates an embodiment of the invention which is not quite as direct in its connections as the connector 10 described above, but which is similarly economical of space and parts necessary for its manufacture.

FIG. 7 illustrates a connector generally indicated as 70 which includes a female connector half 72 identical to the female connector half 14 described above. The male connector half 74, however, is constructed somewhat differently. Instead of a tapered form around which the conductors 20 of a cable 16 can be bent, the male connector half 74 includes a tapered circuit board 76 to which the conductors are connected. The tapered circuit board 76 includes electrically conductive traces 78 on one side equal in number on one side to the conductors of one cable 16 it is desired to connect to another device. As illustrated, two cables 16 are to be utilized so both sides of the tapered circuit board 76 will be furnished with conductive traces 78.

The cables 16 may be attached to the tapered circuit board 76, after stripping the insulation from an area of the cable 16 to expose the conductors 20, by conventional soldering techniques. Preferably, however, the conductors 20 of the cable 16 are attached to the tapered circuit board 76 by means of a "Z-axis" foam or adhesive 80 which conducts electricity only in a direction normal to its major surfaces. The conductive foam or adhesive 80 is disposed between the conductors 20 of the cable 16 and the traces 78 of the tapered circuit board 76. The cable 16 is pressed against the conductive material 80 by a two-part housing 82 which bears against resilient pads 84. The tapered circuit board 76 operates in conjunction with the female connector half 76 as described above to generate high contact normal forces and accomplish retention of the male connector half 74 within the female connector half 76.

Thus there has been described a connector which greatly reduces the number of component commonly associated with connectors of the type described. Although the connector has been described with respect to two embodiments, it will be apparent, however, that numerous modifications are possible without departing from the spirit of the invention. For example, it is not necessary that both sides of the male connector half, and corresponding walls of the female connector half, be tapered with respect to the vertical axis of the connector halves. One side of the male and female connector halves could be vertical and the other tapered, particularly in the instance where contacts will be disposed on only one side of the connector halves. In such a situation, it would be possible to locate the contacts of the connector halves on either the vertical or tapered surface. Also, the conductive traces of the tapered circuit board can be achieved by bonding flexible circuitry to one or both faces of a simple tapered form by means of an adhesive or an adhesive-coated sheet. The tapered form could be manufactured in two halves attached to each other by adhesive or an adhesive-coated sheet. If the sheet were a resilient product, such as a foam, compression and resiliency of the material would additionally produce a normal force at the contact surfaces. Finally, although the connector has been illustrated as being used with a cable or cables which correspond in width to the connector halves, cables of lesser width could be used if not all available locations on the connector halves are necessary or more than one narrower cables can be placed side-by-side and their conductors all disposed on one side of the male connector half. Finally, the connector could be used with individual insulated wires.

I claim:

1. An electrical connector comprising:

a male connector half terminating in a plug end having a vertical axis and two major surfaces wherein at least one of said major surfaces is a tapered surface disposed at an acute angle to said vertical axis;

a female connector half having walls defining a receptacle for said male connector half and a vertical axis parallel to said male connector half vertical axis wherein one of said walls is a tapered wall disposed at an angle to said female connector half vertical axis corresponding to said acute angle of said male connector half tapered surface;

at least said male tapered surface and at least said female tapered wall each including corresponding individual electrical contact traces lying in planes parallel to said male tapered surface and said female tapered side wall, respectively, for making electrical contact between said male connector half and said female connector half when said connector halves are mated so as to force said male tapered surface and said female tapered wall together; and wherein said male connector half terminates an electrical cable comprising a series of parallel conductors encapsulated in an electrically insulating sheath, said tapered surface includes a series of parallel grooves, and said electrical contact traces are exposed conductors of said cable disposed one each in a said groove.

2. An electrical connector according to claim 1 wherein said male connector half includes one tapered major surface and an opposite vertical major surface parallel to said vertical axis of said male connector half and said female connector half includes a vertical wall corresponding to said male connector half vertical surface.

3. An electrical connector according to claim 2 wherein both major surfaces of said male connector half and corresponding walls of said female connector half include electrical contact traces.

4. An electrical connector according to claim 1 wherein both major surfaces of said male connector half and corresponding walls of said female connector half are tapered surfaces inclined at opposite but equal acute angles with respect to said vertical axes of said connector halves.

5. An electrical connector according to claim 4 wherein both major surfaces of said male connector half and corresponding walls of said female connector half include electrical contact traces.

6. An electrical connector according to claim 1 wherein said female connector half includes a flexible circuit overlying a wall of said female connector half and defining said contact traces, said flexible circuit including a polymeric backing and electrically conductive pathways attached thereto.

7. An electrical connector according to claim 6 wherein said female connector half further includes a resilient member disposed between said flexible circuit and said wall of said female connector half which said flexible circuit overlies.

8. An electrical connector according to claim 7 wherein said resilient member is a fluid-filled bladder.

* * * * *